(12) United States Patent
Dewey et al.

(10) Patent No.: US 10,090,405 B2
(45) Date of Patent: *Oct. 2, 2018

(54) SEMICONDUCTOR DEVICE HAVING GROUP III-V MATERIAL ACTIVE REGION AND GRADED GATE DIELECTRIC

(71) Applicant: Intel Corporation, Santa Clara, CA (US)

(72) Inventors: Gilbert Dewey, Hillsboro, OR (US); Marko Radosavljevic, Beaverton, OR (US); Ravi Pillarisetty, Portland, OR (US); Matthew V. Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/466,715

(22) Filed: Mar. 22, 2017

(65) Prior Publication Data

US 2017/0194469 A1    Jul. 6, 2017

Related U.S. Application Data

(63) Continuation of application No. 14/912,887, filed as application No. PCT/US2013/062317 on Sep. 27, 2013, now Pat. No. 9,640,646.

(51) Int. Cl.
*H01L 29/775*    (2006.01)
*H01L 29/06*    (2006.01)
(Continued)

(52) U.S. Cl.
CPC ........ *H01L 29/775* (2013.01); *H01L 29/0673* (2013.01); *H01L 29/155* (2013.01);
(Continued)

(58) Field of Classification Search
CPC . H01L 29/775; H01L 29/0673; H01L 29/155; H01L 29/205; H01L 29/42364;
(Continued)

(56) References Cited

U.S. PATENT DOCUMENTS

| 6,236,076 B1 | 5/2001 | Arita et al. |
| 2001/0041250 A1 | 11/2001 | Werkhoven et al. |

(Continued)

FOREIGN PATENT DOCUMENTS

| CN | 103493206 | 1/2014 |
| TW | 449924 | 8/2001 |

(Continued)

OTHER PUBLICATIONS

International Search Report and Written Opinion from PCT/US2013/062317 dated Jun. 23, 2014, 9 pgs.

(Continued)

*Primary Examiner* — Karen Kusumakar
(74) *Attorney, Agent, or Firm* — Schwabe, Williamson & Wyatt P.C.

(57) ABSTRACT

Semiconductor devices having group III-V material active regions and graded gate dielectrics and methods of fabricating such devices are described. In an example, a semiconductor device includes a group III-V material channel region disposed above a substrate. A gate stack is disposed on the group III-V material channel region. The gate stack includes a graded high-k gate dielectric layer disposed directly between the III-V material channel region and a gate electrode. The graded high-k gate dielectric layer has a lower dielectric constant proximate the III-V material channel region and has a higher dielectric constant proximate the gate electrode. Source/drain regions are disposed on either side of the gate stack.

19 Claims, 8 Drawing Sheets

(51) Int. Cl.
*H01L 29/15* (2006.01)
*H01L 29/205* (2006.01)
*H01L 29/423* (2006.01)
*H01L 29/49* (2006.01)
*H01L 29/51* (2006.01)
*H01L 29/66* (2006.01)
*H01L 29/786* (2006.01)

(52) U.S. Cl.
CPC ...... *H01L 29/205* (2013.01); *H01L 29/42364* (2013.01); *H01L 29/42392* (2013.01); *H01L 29/4908* (2013.01); *H01L 29/517* (2013.01); *H01L 29/66469* (2013.01); *H01L 29/78681* (2013.01); *H01L 29/78696* (2013.01)

(58) Field of Classification Search
CPC ........... H01L 29/42392; H01L 29/4908; H01L 29/517; H01L 29/518; H01L 29/66469; H01L 29/78681; H01L 29/78; B82Y 10/00; B82Y 40/00
See application file for complete search history.

(56) References Cited

U.S. PATENT DOCUMENTS

| | | | |
|---|---|---|---|
| 2002/0137250 A1* | 9/2002 | Nguyen | H01L 21/02178 438/53 |
| 2007/0049043 A1 | 3/2007 | Muthukrishnan et al. | |
| 2007/0063266 A1 | 3/2007 | Natori et al. | |
| 2007/0170541 A1* | 7/2007 | Chui | H01L 21/28255 257/506 |
| 2010/0184260 A1 | 7/2010 | Luo et al. | |
| 2010/0207208 A1* | 8/2010 | Bedell | B82Y 10/00 257/346 |
| 2010/0301390 A1 | 12/2010 | Ko et al. | |
| 2011/0095267 A1 | 4/2011 | Bryant et al. | |
| 2011/0140171 A1 | 6/2011 | Pillarisetty et al. | |
| 2011/0163297 A1 | 7/2011 | Crowder et al. | |
| 2011/0233522 A1* | 9/2011 | Cohen | H01L 29/0673 257/24 |
| 2012/0126338 A1 | 5/2012 | Juengling | |
| 2012/0193677 A1 | 8/2012 | Parikh et al. | |
| 2012/0292665 A1 | 11/2012 | Marino et al. | |
| 2013/0032783 A1 | 2/2013 | Pillarisetty et al. | |
| 2013/0049068 A1 | 2/2013 | Lin et al. | |
| 2013/0062699 A1 | 3/2013 | Zhu et al. | |

FOREIGN PATENT DOCUMENTS

| | | |
|---|---|---|
| TW | 200711132 | 3/2007 |
| TW | 201034126 | 9/2010 |
| TW | 201104866 | 2/2011 |
| WO | WO-2013095345 | 6/2013 |
| WO | WO-2013095377 | 6/2013 |
| WO | WO-2013103163 | 7/2013 |

OTHER PUBLICATIONS

Non-Final Office Action for Taiwan Patent Application No. 103132426 dated Nov. 17, 2015. 5 pgs.
International Preliminary Report on Patentability for PCT/US2013/062317 dated Apr. 7, 2016, 5 pgs.
Non-Final Office and Search Report for Taiwanese Patent Application No. 105113522 dated Dec. 1, 2016, 8 pgs.
Non-Final Office Action from U.S. Appl. No. 14/912,887 dated Sep. 8, 2016, 15 pgs.
Extended European Search Report for European Patent Application No. 13894196.8 dated May 15, 2017, 8 pgs.
Office Action from Taiwan Patent Application No. 106120223, dated Nov. 30, 2018, 6 pages.

* cited by examiner

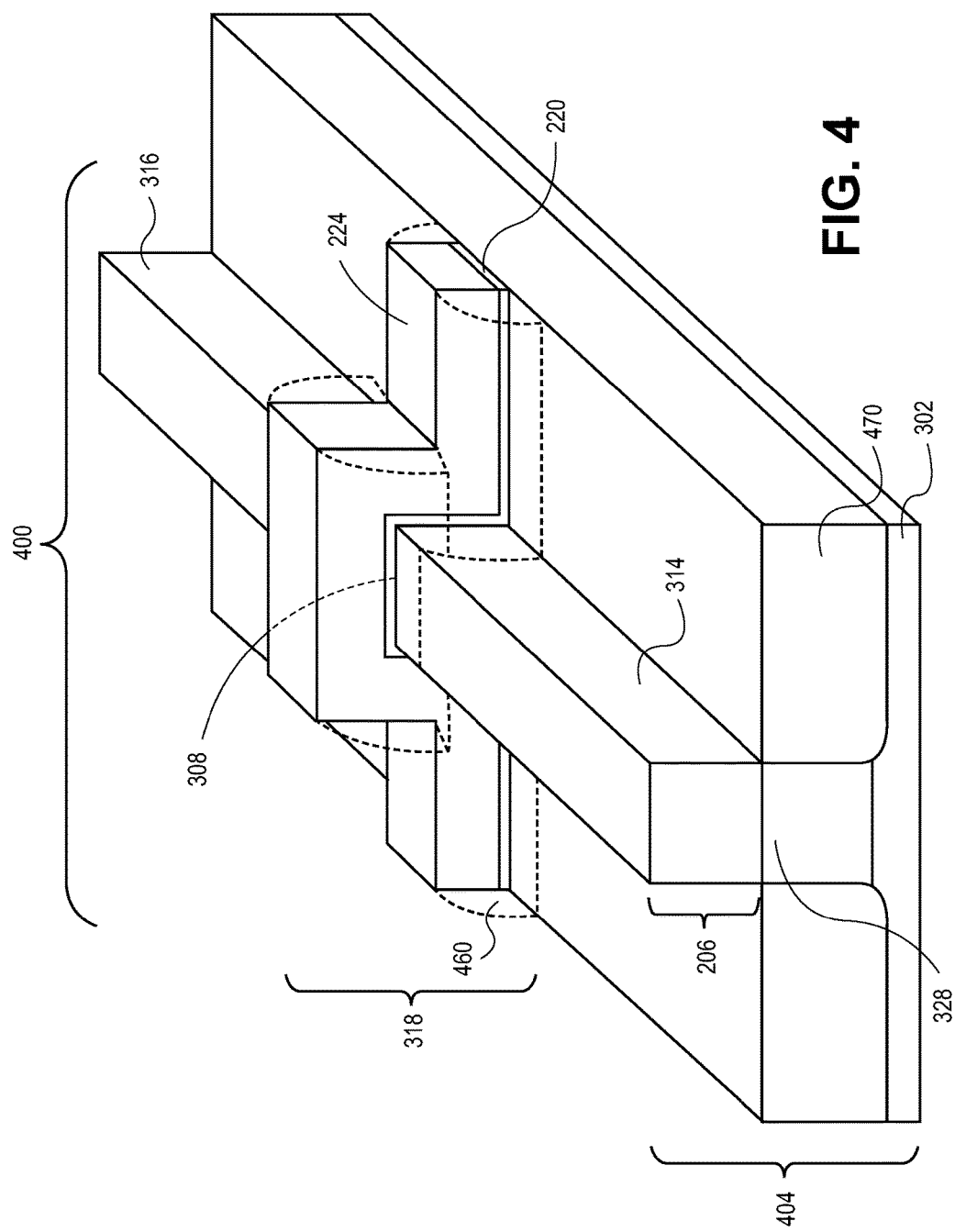

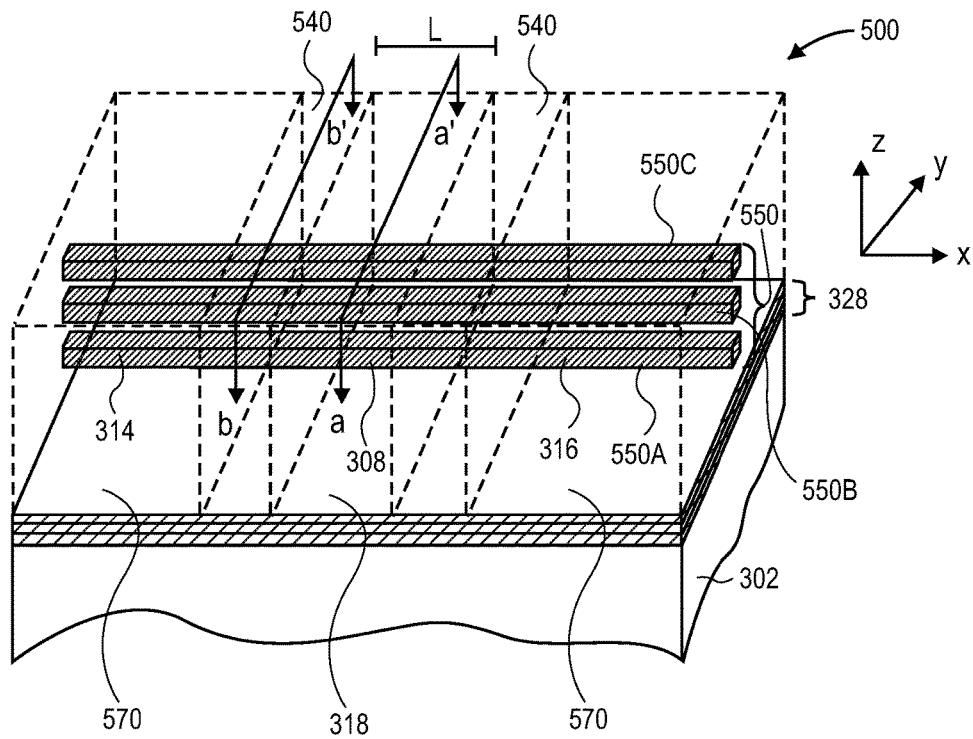
FIG. 5A
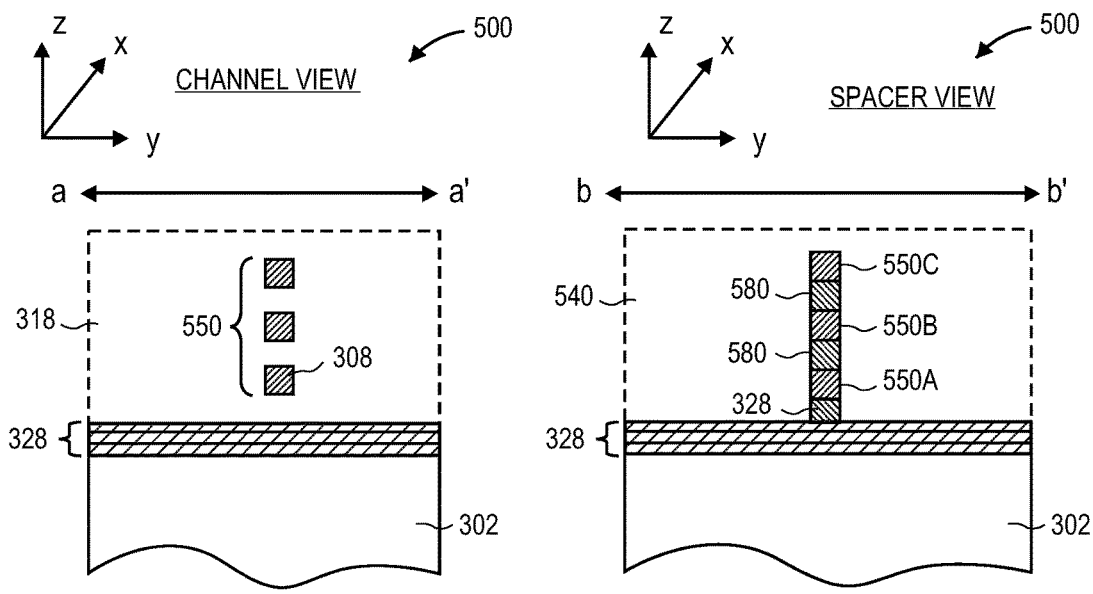
FIG. 5B     FIG. 5C

SEMICONDUCTOR DEVICE HAVING GROUP III-V MATERIAL ACTIVE REGION AND GRADED GATE DIELECTRIC

CROSS-REFERENCE TO RELATED APPLICATIONS

This application is a continuation of U.S. patent application Ser. No. 14/912,887, filed on Feb. 18, 2016, which is a U.S. National Phase application under 35 U.S.C. § 371 of International Application No. PCT/US2013/062317, filed Sep. 27, 2013, entitled "SEMICONDUCTOR DEVICE HAVING GROUP III-V MATERIAL ACTIVE REGION AND GRADED GATE DIELECTRIC," the entire contents of which are hereby incorporated by reference herein.

TECHNICAL FIELD

Embodiments of the invention are in the field of semiconductor devices and, in particular, non-planar semiconductor devices having group III-V material active regions and graded gate dielectrics.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Semiconductor devices formed in epitaxially grown semiconductor hetero-structures, such as in group III-V material systems, offer exceptionally high carrier mobility in the transistor channels due to low effective mass along with reduced impurity scattering. Such devices provide high drive current performance and appear promising for future low power, high speed logic applications. However, significant improvements are still needed in the area of group III-V material-based devices.

Additionally, in the manufacture of integrated circuit devices, multi-gate transistors, such as tri-gate transistors, have become more prevalent as device dimensions continue to scale down. Many different techniques have been attempted to reduce junction leakage of such transistors. However, significant improvements are still needed in the area of junction leakage suppression.

BRIEF DESCRIPTION OF THE DRAWINGS

FIG. 4 illustrates an angled view of a non-planar semiconductor device having a group III-V material active region with a graded gate dielectric, in accordance with an embodiment of the present invention.

FIG. 5A illustrates a three-dimensional cross-sectional view of a nanowire-based semiconductor structure having a graded gate dielectric, in accordance with an embodiment of the present invention.

FIG. 5B illustrates a cross-sectional channel view of the nanowire-based semiconductor structure of FIG. 5A, as taken along the a-a' axis, in accordance with an embodiment of the present invention.

FIG. 5C illustrates a cross-sectional spacer view of the nanowire-based semiconductor structure of FIG. 5A, as taken along the b-b' axis, in accordance with an embodiment of the present invention.

DESCRIPTION OF THE EMBODIMENTS

Figure 1A:
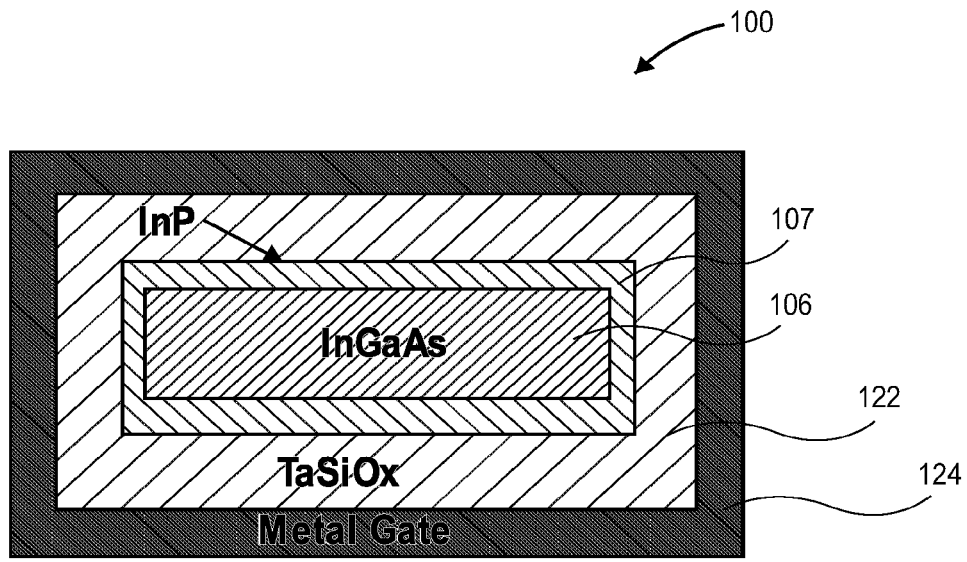
FIG. 1A illustrates a cross-sectional view of a portion of a gate all-around non-planar semiconductor device having group III-V material active region and a cladding layer.

Semiconductor devices having group III-V material active regions and graded gate dielectrics and methods of fabricating such devices are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to semiconductor devices, such as non-planar semiconductor devices, having group III-V material active regions with graded gate dielectrics. In particular, graded oxide/passivation features for group III-V material non-planar transistors are described. Embodiments may cover approaches for fabricating devices having one or more of a graded gate oxide, a III-V material channel, high-k gate dielectrics, high mobility channel regions, low off-state leakage, oxide Grading for high µeff, and may be applicable to transistors (such as metal oxide semiconductor field effect transistors (MOSFETs)) based on non-silicon channel configurations. In an embodiment, various approaches are provided for achieving dielectric constant grading for high quality oxide on high mobility channels.

To provide general context for one or more embodiments described herein, past architectures for related devices may include or invoke a leakage path in a III-V material based transistor. The leakage path may be below the gate electrode and through a larger band-gap bottom barrier since the larger band-gap material is in contact with a homogeneous high-k gate dielectric and may not be compatible with such a dielectric. Such contact with the high-k gate dielectric may result in an large density of interface traps and allow for a conduction path outside of the gate control of the device, thereby limiting the off-state leakage of the III-V transistor. Such issues may be enhanced in non-planar transistor structures.

To provide a more specific context for one or more embodiments described herein, fabrication of a gate dielectric directly on a channel region and especially in a thin body, gate all around architecture with novel channel materials such as III-V and Ge is challenging yet integral to achieving high performance, well controlled transistors. When the channel mobility is high and the dielectric constant of the oxide is large, there can be considerable mobility degradation due to phonon scattering between the dielectric and the channel region. The degradation may be worse the higher the mobility of the channel region and the higher the dielectric constant of the oxide. However, both are needed for continued scaling and performance enhancement. Accordingly, one or more embodiments described herein target new dielectric combinations that grade the dielectric constant from low near the channel interface to very high distal the channel interface, thereby achieving thin EOT and high effective dielectric constant. Nonetheless, the dielectric constant is maintained to a minimum near the channel where the interaction is strongest, improving both the overall mobility and oxide quality, and maintaining good channel control for high performance ultra scaled transistors.

In accordance with an embodiment of the present invention, then, a dielectric material layer is graded such that the dielectric constant is low near a channel region and high near a metal gate to achieve higher mobility channels in high mobility material systems without sacrificing gate control or charge. In one such example, improved oxide-III-V channel characteristics are demonstrated as being beyond the best state of the art. In one embodiment, overall oxide thickness (charge) is maintained, but continuous dielectric constant grading is achieved by the introduction of a ternary oxide (e.g., TaAlOx as an example) where grading the levels of Ta and Al results in a dielectric constant that is low at the channel-oxide interface to high and the metal oxide interface. In an embodiment, the resultant transistor has improved Dit at the channel interface, and improved mobility because of the dielectric grading. The ternary oxide also can enable the freedom of engineering the dielectric constant in the gate region.

As an example of a conventional approach, FIG. 1A illustrates a cross-sectional view of a portion of a gate all-around non-planar semiconductor device 100 having a group III-V material active region and a cladding layer thereon. Referring to FIG. 1A, an InGaAs channel 106 has an InP cladding layer 107 disposed thereon. A homogeneous TaSiOx gate dielectric 122 and metal gate 124 make up the gate stack disposed on the InGaAs channel 106/InP cladding layer 107 pairing. For the example shown in FIG. 1A, experimental details of which are described below, challenges remain for such a gate-all-around device with respect to (1) Dit is still higher than Si—HfO$_2$, and (2) a 30-60% mobility loss in cases where TaSiOx is formed directly on InGaAs, i.e. an encumbering cladding layer is needed.

Figure 1B:
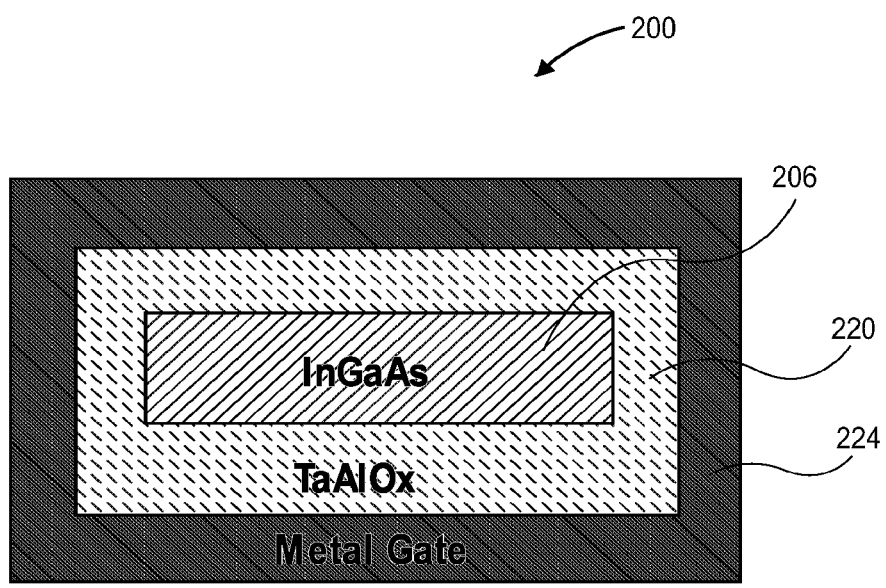
FIG. 1B illustrates a cross-sectional view of a portion of a gate all-around non-planar semiconductor device having a group III-V material active region and a graded high-k gate dielectric layer directly thereon, in accordance with an embodiment of the present invention.

By contrast to FIG. 1A, as an example of a cladding-free device, FIG. 1B illustrates a cross-sectional view of a portion of a gate all-around non-planar semiconductor device 200 having a group III-V material active region and a graded high-k gate dielectric layer directly thereon, in accordance with an embodiment of the present invention. In particular, semiconductor device 200 includes a III-V material channel region 206 (exemplary embodiment here is gate-all-around InGaAs) surrounded by a gate stack composed of a TaAlOx gate dielectric 220 and a metal gate electrode 224. In one embodiment, then, a new dielectric (TaAlOx) is situated directly between the gate and channel of device 200. In an embodiment, the Al and Ta ratios are graded within the TaAlOx gate dielectric layer 220 in order to provide a lower dielectric constant of approximately 8 (e.g., Al rich) at the channel interface which is graded to a higher dielectric constant (approximately 21, and even as high as 30) at the metal gate interface by increasing the Ta content. Embodiments may also or instead include graded materials of various combinations of dielectrics (e.g., LaAlOx, TiAlOx, HfAlOx, ZrAlOx, etc). In an embodiment, advantages of such an arrangement include, but are not limited to, (1) lower K and better interface properties with High Al % to provide better mobility, (2) a dielectric constant that is readily gradable, e.g., from 8 to 21, to enable thin EOT and high mobility without use of an intervening InP cladding layer. In another embodiment, the above described aluminum component is substituted with Si, which is graded throughout the film, e.g., such as a graded layer of TiSiOx.

One or more embodiments described herein, then, enables direct dielectric growth on channel wire material without the need for cladding layer. This allows the fabrication of smaller dimensions, e.g., thin wires. In an embodiment, by grading the dielectric layer, a gradual transition of film composition is achieved that is smooth with dielectric changes occurring in a non-stepwise fashion. In an embodiment, increments of 2 can be made in the graded dielectric layer approximately every 2-3 Angstroms of deposited material.

Referring again to FIG. 1B, then, in an embodiment, the graded high-k gate dielectric layer 220 is composed of MAlOx having a greater concentration of aluminum proximate the III-V material channel region and a lesser concentration of aluminum proximate the gate electrode. M is a metal such as, but not limited to Ta, Zr, Hf, Gd, La, or Ti. In one embodiment, M is Ta, the lower dielectric constant is approximately 8, and the higher dielectric constant is approximately 21. In one embodiment, the graded high-k gate dielectric layer has a thickness approximately in the range of 2-3.5 nanometers. In one embodiment, the III-V material channel region is composed of InGaAs, the graded high-k gate dielectric layer is composed of TaAlOx, and the gate electrode is a metal gate electrode. In an embodiment, the TaAlOx is formed by atomic layer deposition (ALD), where the Al is delivered by trimethylaluminum (TMA) or Et$_2$MeAl, and the Ta is delivered by TaCl$_5$ or Ta ethoxide. In one embodiment, the formation of TaAlOx is effectively viewed as inserting Al atoms into some O sites in Ta$_2$O$_5$. In an embodiment, aluminum is required in the graded dielectric, but the Ta may be substituted with Zr, Hf, Gd, La, or Ti.

Figure 2A:
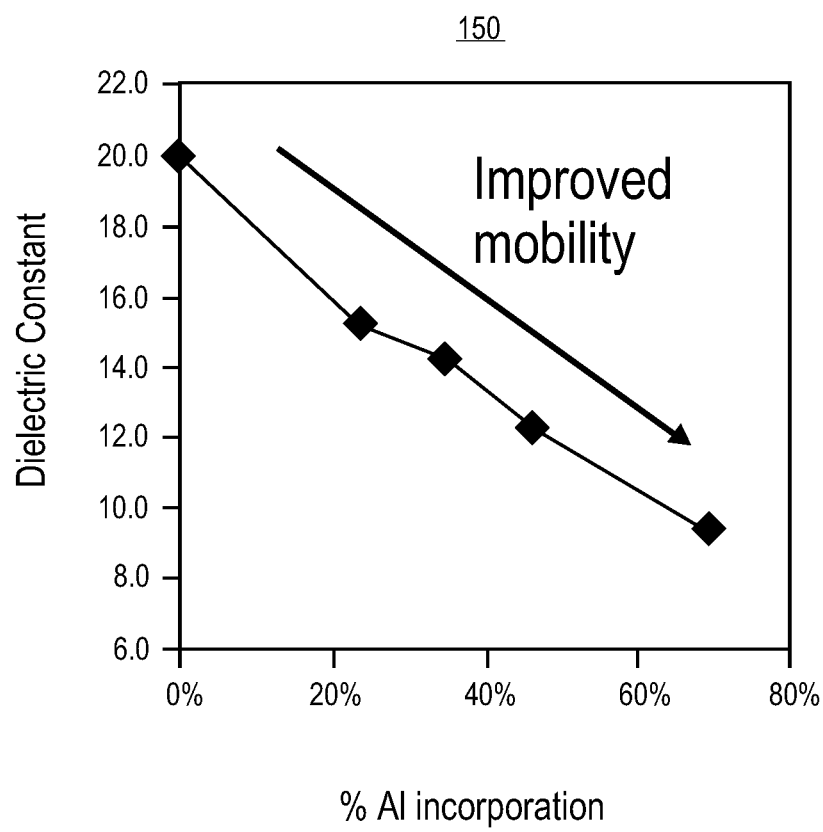
FIG. 2A is a plot of dielectric constant as a function of % Al incorporation for a TaAlOx dielectric layer, in accordance with an embodiment of the present invention.

FIG. 2A is a plot 150 of dielectric constant as a function of % Al incorporation for a TaAlOx dielectric layer, in accordance with an embodiment of the present invention. Referring to plot 150, the dielectric constant has been graded approximately from 8 to 20 by increasing the Ta content in the oxide. A lower dielectric constant at the interface decreases the optical phonon scattering cause by strong oxide bonds (high K oxides) and results in improved mobility in the channel.

Figure 2B:
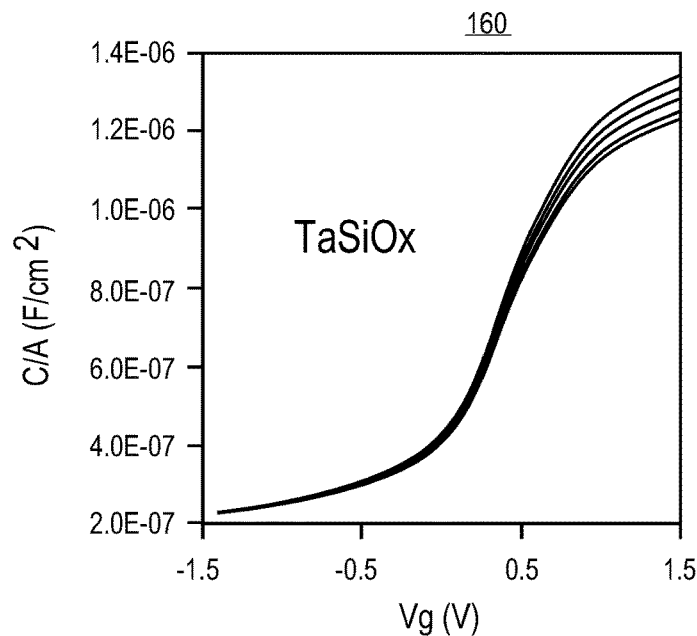
FIG. 2B is a plot of C/A (in F/cm$^2$) as a function of Vg (in Volts) for a TaSiOx dielectric layer.
Figure 2C:
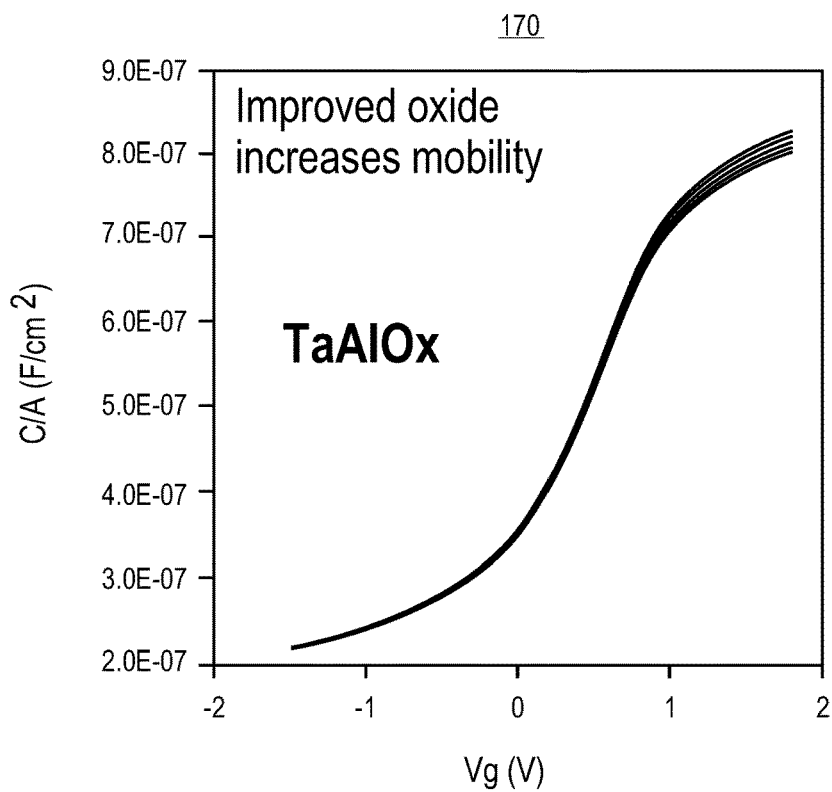
FIG. 2C is a plot of C/A (in F/cm$^2$) as a function of Vg (in Volts) for a TaAlOx dielectric layer, in accordance with an embodiment of the present invention.

FIG. 2B is a plot 160 of C/A (in F/cm$^2$) as a function of Vg (in Volts) for a TaSiOx dielectric layer. By contrast, FIG. 2C is a plot 170 of C/A (in F/cm$^2$) as a function of Vg (in Volts) for a TaAlOx dielectric layer, in accordance with an embodiment of the present invention. Referring to plots 160 and 170 as taken together, in addition to the mobility enhancement achieved without need to resort to a dual layer oxide, the oxide quality of the TaAlOx-III-V interface is improved over that of the state of the art TaSiOx. The C-V curves show reduced frequency dispersion for the TaAlOx dielectric as compared with TaSiOx. The improved oxide characteristics can provide an improved mobility and channel control.

In one aspect, methods of fabricating a group III-V material-based semiconductor structure with a graded high-k gate dielectric layer are provided. For example, FIGS. 3A-3E illustrate cross-sectional views representing various operations in a method of fabricating a non-planar semiconductor device having a group III-V material active region with a graded gate dielectric, in accordance with an embodiment of the present invention. It is to be understood that like feature designations of FIGS. 3A-3E may be as described in association with FIG. 1B.

Figure 3A:
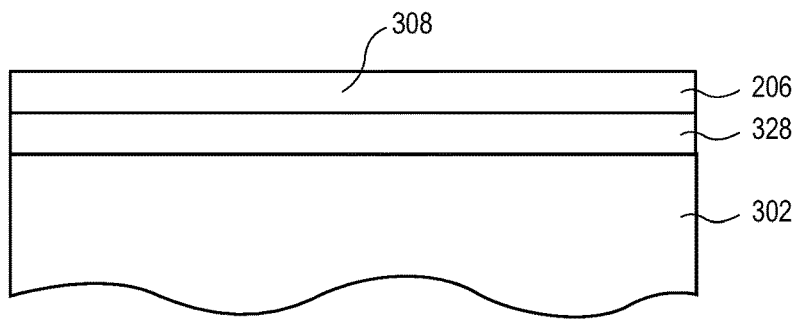
FIGS. 3A-3E illustrate cross-sectional views representing various operations in a method of fabricating a non-planar semiconductor device having a group III-V material active region with a graded gate dielectric, in accordance with an embodiment of the present invention.

Referring to FIG. 3A, a bottom barrier layer 328 is formed above a substrate 302. A III-V material layer is then formed on bottom barrier layer 328 and patterned to form three-dimensional material body 206 with channel region 308. Alternatively, the III-V material layer may be formed after or during the trench formation described below in association with FIG. 3C.

Figure 3B:
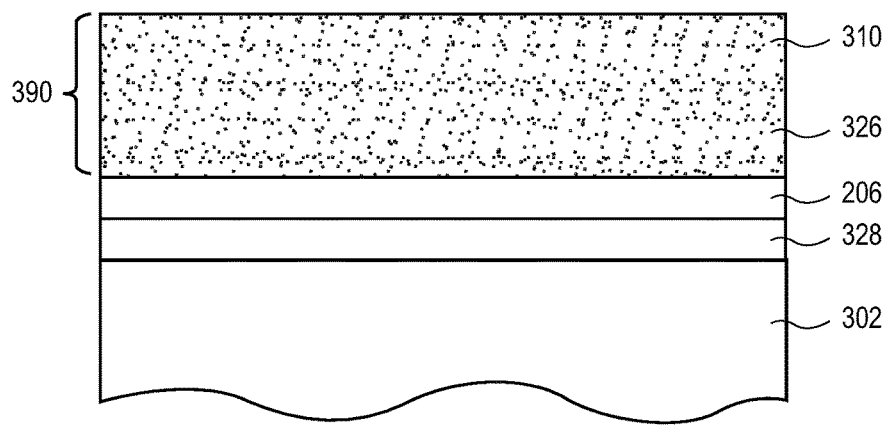

Referring to FIG. 3B, a hetero-structure 390, which may include a top barrier layer 326 and source and drain material region 310, is formed above the three-dimensional material body 206 (or above the III-V material layer, if not yet patterned).

Figure 3C:
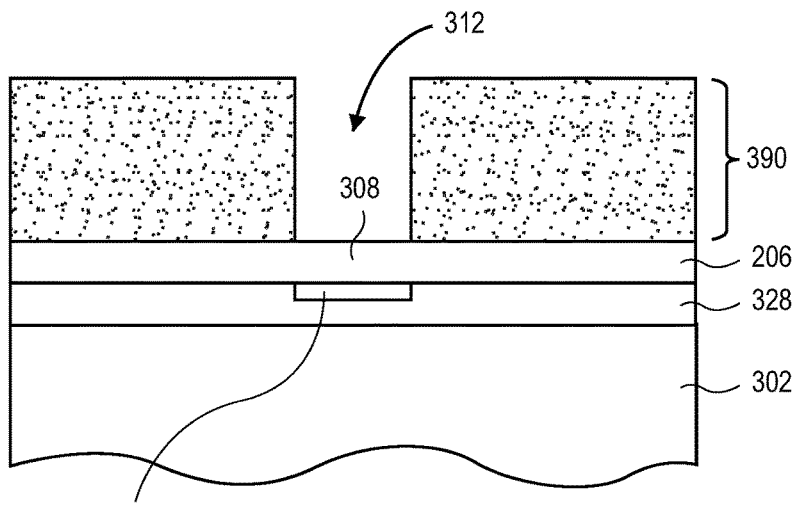

Referring to FIG. 3C, a trench 312 is formed in hetero-structure 390 and partially into bottom barrier layer 328, exposing channel region 308. In an embodiment, trench 312 is formed by a dry or wet etch process.

Figure 3D:
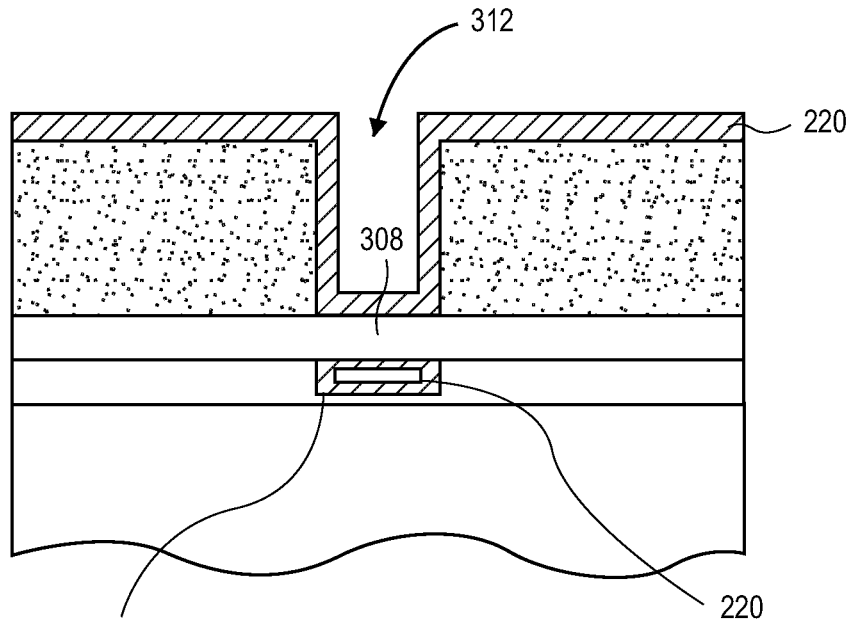

Referring to FIG. 3D, a graded dielectric layer 220 is formed in trench 312 and surrounding channel region 308. Then, referring to FIG. 3E, a gate electrode 224 is formed on the graded dielectric layer 220.

Figure 3E:
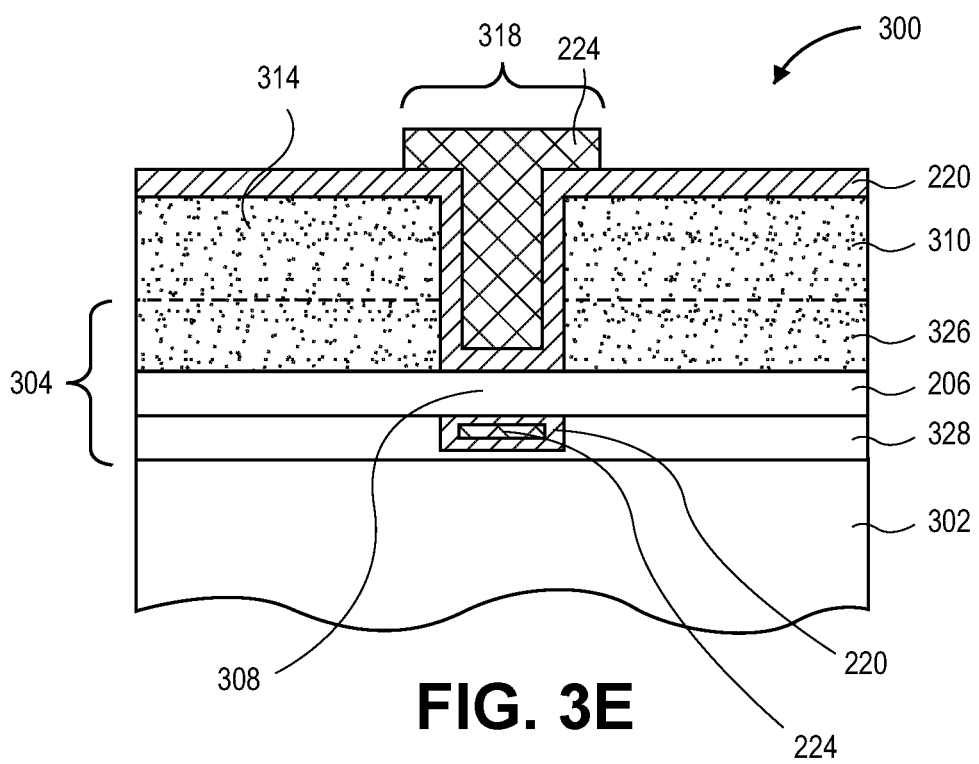

Thus, FIG. 3E illustrates a cross-sectional view of a non-planar semiconductor device 300 having a group III-V material active region with a graded gate dielectric layer, in accordance with an embodiment of the present invention. Referring again to FIG. 3E, then the semiconductor device 300 includes a hetero-structure 304 disposed above the substrate 302. The hetero-structure 304 includes the three-dimensional group III-V material body 206 having the channel region 308. The source and drain material region 310 is disposed above the three-dimensional group III-V material body 206. A trench is disposed in the source and drain material region 310, separating a source region 314 from a drain region 316, and exposing at least a portion of the channel region 308. A gate stack 318 is disposed in the trench and on the exposed portion of the channel region 308. The gate stack 218 includes the graded dielectric layer 220 and the gate electrode 224. Although depicted as T-shaped, gate electrode 224 may instead have the T-portions trimmed in order to reduce capacitance effects. It is to be appreciated that the gate stack 318 includes a portion below the channel region 308, as is depicted in FIG. 3E.

Referring again to FIG. 3E, in an embodiment, the hetero-structure 304 further includes a top barrier layer 326 (shown by the dashed lines in FIG. 3E) disposed between the source and drain material region 310 and the three-dimensional group III-V material body 206. The trench is also disposed in the top barrier layer 326. In an embodiment, the hetero-structure 304 further includes the bottom barrier layer 328 disposed between the substrate 302 and the three-dimensional group III-V material body 206. In one such embodiment, the trench is also partially disposed in the bottom barrier layer 328, completely exposing the channel region 308. In that embodiment, the gate stack 318 completely surrounds the channel region 308, as indicated in FIG. 3E.

Substrate 302 may be composed of a material suitable for semiconductor device fabrication. In one embodiment, substrate 302 is a bulk substrate composed of a single crystal of a material which may include, but is not limited to, silicon, germanium, silicon-germanium or a III-V compound semiconductor material. In another embodiment, substrate 302 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 302 includes a top epitaxial layer on a middle insulator layer which is above a lower bulk layer. The top epitaxial layer is composed of a single crystal layer which may include, but is not limited to, silicon (e.g., to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 302 may further include dopant impurity atoms.

Hetero-structure 304 includes a stack of one or more crystalline semiconductor layers, such as a compositional buffer layer (not shown) with the bottom barrier layer 328 disposed thereon. The compositional buffer layer may be composed of a crystalline material suitable to provide a specific lattice structure onto which a bottom barrier layer may be formed with negligible dislocations. For example, in accordance with an embodiment of the present invention, the compositional buffer layer is used to change, by a gradient of lattice constants, the exposed growth surface of semiconductor hetero-structure 304 from the lattice structure of substrate 302 to one that is more compatible for epitaxial growth of high quality, low defect layers thereon. In one embodiment, the compositional buffer layer acts to provide a more suitable lattice constant for epitaxial growth instead of an incompatible lattice constant of substrate 302. In an embodiment, substrate 302 is composed of single-crystal silicon and the compositional buffer layer grades to a bottom barrier layer composed of a layer of InAlAs having a thickness of approximately 1 micron. In an alternative embodiment, the compositional buffer layer is omitted because the lattice constant of substrate 302 is suitable for the growth of a bottom barrier layer 328 for a quantum-well semiconductor device.

The bottom barrier layer 328 may be composed of a material suitable to confine a wave-function in a quantum-well formed thereon. In accordance with an embodiment of the present invention, the bottom barrier layer 328 has a lattice constant suitably matched to the top lattice constant of the compositional buffer layer, e.g., the lattice constants are similar enough that dislocation formation in the bottom barrier layer 328 is negligible. In one embodiment, the bottom barrier layer 328 is composed of a layer of approximately $In_{0.65}Al_{0.35}As$ having a thickness of approximately 10 nanometers. In a specific embodiment, the bottom barrier layer 328 composed of the layer of approximately $In_{0.65}Al_{0.35}As$ is used for quantum confinement in an N-type semiconductor device. In another embodiment, the bottom barrier layer 328 is composed of a layer of approximately $In_{0.65}Al_{0.35}Sb$ having a thickness of approximately 10 nanometers. In a specific embodiment, the bottom barrier layer 328 composed of the layer of approximately $In_{0.65}Al_{0.35}Sb$ is used for quantum confinement in a P-type semiconductor device.

The three-dimensional group III-V material body 206 may be composed of a material suitable to propagate a wave-function with low resistance. In accordance with an embodiment of the present invention, three-dimensional group III-V material body 206 has a lattice constant suitably matched to the lattice constant of the bottom barrier layer 328 of hetero-structure 304, e.g., the lattice constants are similar enough that dislocation formation in three-dimensional group III-V material body 206 is negligible. In an embodiment, three-dimensional group III-V material body 206 is composed of groups III (e.g. boron, aluminum, gallium or indium) and V (e.g. nitrogen, phosphorous, arsenic or antimony) elements. In one embodiment, three-dimensional group III-V material body 206 is composed of InAs, InSb, or InGaAs. The three-dimensional group III-V material body 206 may have a thickness suitable to propagate a substantial portion of a wave-function, e.g. suitable to inhibit a significant portion of the wave-function from entering the bottom barrier layer 328 of hetero-structure 304 or a top barrier layer (e.g., barrier layer 326) formed on three-dimensional group III-V material body 206. In an embodiment, three-dimensional group III-V material body 206 has a thickness (height) approximately in the range of 50-100 Angstroms. The width (dimension taken into the page as shown) may have approximately the same dimension, providing a three-dimensional wire-type feature.

Top barrier layer 326 may be composed of a material suitable to confine a wave-function in a III-V material body/channel region formed there under. In accordance with an embodiment of the present invention, top barrier layer 326 has a lattice constant suitably matched to the lattice constant of channel region 206, e.g., the lattice constants are similar enough that dislocation formation in top barrier layer 326 is negligible. In one embodiment, top barrier layer 326 is composed of a layer of material such as, but not limited to, N-type InGaAs. Source and drain material region 310 may be doped group III-V material region, such a more heavily doped structure formed from the same or similar material as top barrier layer 326. In other embodiments, the composition of source and drain material region 310, aside from doping differences, differs from the material of top barrier layer 326.

Semiconductor device 200 or 300 may be a semiconductor device incorporating a gate, a channel region and a pair of source/drain regions. In an embodiment, semiconductor device 200 or 300 is one such as, but not limited to, a MOS-FET or a Microelectromechanical System (MEMS). In one embodiment, semiconductor device 200 or 300 is a planar or three-dimensional MOS-FET and is an isolated device or is one device in a plurality of nested devices. As will be appreciated for a typical integrated circuit, both N- and P-channel transistors may be fabricated on a single substrate to form a CMOS integrated circuit. Furthermore, additional interconnect wiring may be fabricated in order to integrate such devices into an integrated circuit.

The above described devices can be viewed as trench-based devices, where a gate wraps a channel region within a trench of a stack of III-V material layers. However, other devices may include a protruding III-V channel regions, such as in a tri-gate or FIN-FET based MOS-FETs. For example, FIG. 4 illustrates an angled view of a non-planar semiconductor device having a group III-V material active region with a graded gate dielectric, in accordance with an embodiment of the present invention.

Referring to FIG. 4, a semiconductor device 400 includes a hetero-structure 404 disposed above a substrate 302. The hetero-structure 404 includes a bottom barrier layer 328. A three-dimensional group III-V material body 206 with a channel region 308 is disposed above the bottom barrier layer 328. A gate stack 318 is disposed to surround at least a portion of the channel region 308. In an embodiment, not viewable from the perspective of FIG. 4, the gate stack completely surrounds the channel region 308. The gate stack 318 includes a gate electrode 224 and a graded gate dielectric layer 220. The gate stack may further include dielectric spacers 460.

Source and drain regions 314/316 may be formed in or on portions of the three-dimensional group III-V material body 206 not surrounded by gate stack 318. Furthermore, a top barrier layer may be included in those regions as well. Also, isolation regions 470 may be included. Although depicted in FIG. 4 as being somewhat aligned with the bottom of the bottom barrier layer 328, it is to be understood that the depth of the isolation regions 470 may vary. Also, although depicted in FIG. 4 as being somewhat aligned with the top of the bottom barrier layer 328, it is to be understood that the height of the isolation regions 470 may vary. It is also to be understood that like feature designations of FIG. 4 may be as described in association with FIGS. 1B and 3A-3E.

In another aspect, FIG. 5A illustrates a three-dimensional cross-sectional view of a group III-V material nanowire-based semiconductor structure having a graded gate dielectric, in accordance with an embodiment of the present invention. FIG. 5B illustrates a cross-sectional channel view of the group III-V material nanowire-based semiconductor structure of FIG. 5A, as taken along the a-a' axis. FIG. 5C illustrates a cross-sectional spacer view of the group III-V material nanowire-based semiconductor structure of FIG. 5A, as taken along the b-b' axis.

Referring to FIG. 5A, a semiconductor device 500 includes one or more vertically stacked group III-V material nanowires (550 set) disposed above a substrate 302. Embodiments herein are targeted at both single wire devices and multiple wire devices. As an example, a three nanowire-based devices having nanowires 550A, 550B and 550C is shown for illustrative purposes. For convenience of description, nanowire 550A is used as an example where description is focused on only one of the nanowires. It is to be understood that where attributes of one nanowire are described, embodiments based on a plurality of nanowires may have the same attributes for each of the nanowires.

At least the first nanowire 550A includes a group III-V material channel region 308. The group III-V material channel region 208 has a length (L). Referring to FIG. 5B, the group III-V material channel region 308 also has a perimeter orthogonal to the length (L). Referring to both FIGS. 5A and 5B, a gate electrode stack 318 surrounds the entire perimeter of each of the channel regions of each nanowire 550, including group III-V material channel region 308. The gate electrode stack 318 includes a gate electrode along with a graded gate dielectric layer disposed between the channel regions and the gate electrode (not individually shown). The group III-V material channel region 308 and the channel regions of the additional nanowires 550B and 550C are discrete in that they are completely surrounded by the gate electrode stack 318 without any intervening material such as underlying substrate material or overlying channel fabrication materials. Accordingly, in embodiments having a plurality of nanowires 550, the channel regions of the nanowires are also discrete relative to one another, as depicted in FIG. 5B. Referring to FIGS. 5A-5C, a bottom barrier layer 328 is disposed above substrate 302. The bottom barrier layer 328 is further disposed below the one or more nanowires 550. In an embodiment, the group III-V material channel region 308 is completely surrounded by gate electrode 318, as depicted in FIG. 5B.

Referring again to FIG. 5A, each of the nanowires 550 also includes source and drain regions 314 and 316 disposed in or on the nanowire on either side of the channel regions, including on either side of group III-V material channel region 308. In an embodiment, the source and drain regions 314/316 are embedded source and drain regions, e.g., at least a portion of the nanowires is removed and replaced with a source/drain material region. However, in another embodiment, the source and drain regions 314/316 are composed of, or at least include, portions of the one or more nanowires 550.

A pair of contacts 570 is disposed over the source/drain regions 314/316. In an embodiment, the semiconductor device 500 further includes a pair of spacers 540. The spacers 540 are disposed between the gate electrode stack 318 and the pair of contacts 570. As described above, the channel regions and the source/drain regions are, in at least several embodiments, made to be discrete. However, not all regions of the nanowires 550 need be, or even can be made to be discrete. For example, referring to FIG. 5C, nanowires 550A-550C are not discrete at the location under spacers 540. In one embodiment, the stack of nanowires 550A-550C have intervening semiconductor material 580 there between. In one embodiment, the bottom nanowire 550A is still in contact with a portion of the bottom buffer layer 328, which is otherwise recessed for gate stack 318 formation (FIG. 5B). Thus, in an embodiment, a portion of the plurality of vertically stacked nanowires 550 under one or both of the spacers 540 is non-discrete.

It is to be understood that like feature designations of FIG. 5A-5C may be as described in association with FIGS. 1B, 3A-3E and 4. Also, although the device 500 described above is for a single device, a CMOS architecture may also be formed to include both NMOS and PMOS nanowire-based devices disposed on or above the same substrate. In an embodiment, the nanowires 550 may be sized as wires or ribbons, and may have squared-off or rounded corners.

Advantages of one or more embodiments described above may include one or more of (1) a lower dielectric constant and better interface properties with high Al % for improved better mobility at the channel region, (2) the dielectric constant is readily gradable from 8 to 21 to enable thin EOT and high mobility without the use of a cladding layer such as InP, and (3) enabling of an extension of Moore's Law or increasing the performance of CMOS transistors. One benefit may include achieving high mobility, highly scaled transistors and to continue Moore's law and transistor improvements for high performance, low power microprocessors.

Embodiments described above involving a single layer graded high-k gate dielectric may be distinguished from dual dielectric layer arrangements where two distinct dielectric films are fabricated, typically with a step in dielectric constant at the interface of the dual layers. Present embodiments may provide improved solutions, improved oxide qualities, and the ability to grade the dielectric constant to achieve desired charge and mobility enhancement. In accordance with embodiments described herein, a graded dielectric layer such as described above has been demonstrated on experimental capacitors to have improved interface qualities versus TaSiOx. On the same capacitors, the oxide has been shown to have a gradable dielectric constant by varying the Ta and Al content in the ternary oxide. Mobility has been demonstrated independently to improve with grading such that oxide thickness is maintained while at the same time lowering the dielectric constant only at the channel oxide interface that is most dominant for scattering.

Thus, one or more embodiments described herein are targeted at III-V material active region arrangements integrated with graded gate dielectrics. Although described above with respect to benefits for non-planar and gate-all-around devices, benefits may also be achieved for planar devices without gate wrap-around features. Thus, such arrangements may be included to form III-V material-based transistors such as planar devices, fin or tri-gate based devices, and gate all around devices, including nanowire-based devices. Embodiments described herein may be effective for junction isolation in metal-oxide-semiconductor field effect transistors (MOSFETs). It is to be understood that formation of materials such as the III-V material layers described herein may be performed by techniques such as, but not limited to, chemical vapor deposition (CVD) or molecular beam epitaxy (MBE), or other like processes.

Figure 6:
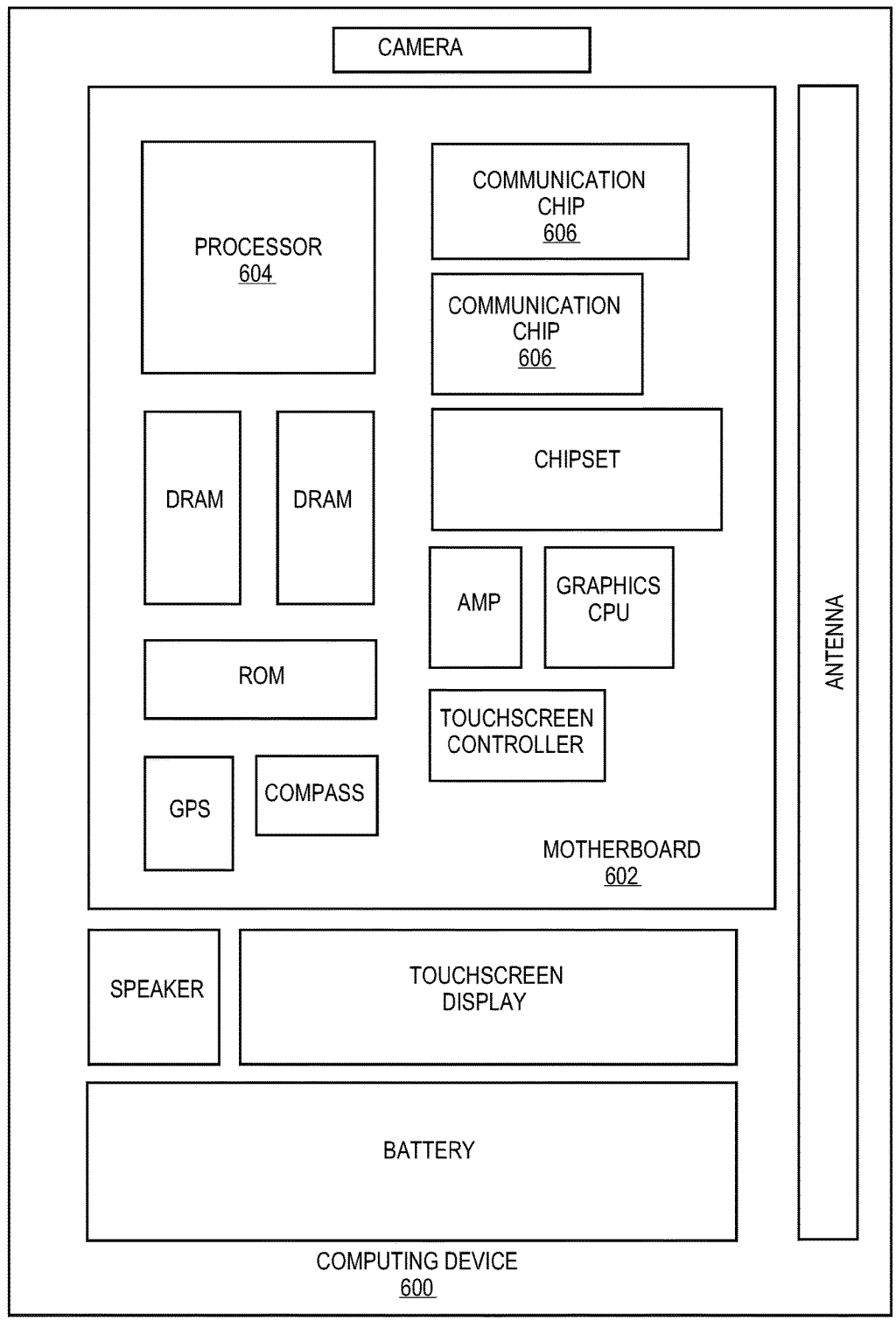
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touch-screen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Thus, embodiments of the present invention include non-planar semiconductor devices having group III-V material active regions and graded gate dielectrics and methods of fabricating such devices.

In an embodiment, a semiconductor device includes a group III-V material channel region disposed above a substrate. A gate stack is disposed on the group III-V material channel region. The gate stack includes a graded high-k gate dielectric layer disposed directly between the III-V material channel region and a gate electrode. The graded high-k gate dielectric layer has a lower dielectric constant proximate the III-V material channel region and has a higher dielectric constant proximate the gate electrode. Source/drain regions are disposed on either side of the gate stack.

In one embodiment, the graded high-k gate dielectric layer is composed of MAlOx having a greater concentration of aluminum proximate the III-V material channel region and a lesser concentration of aluminum proximate the gate electrode. M is a metal such as, but not limited to Ta, Zr, Hf, Gd, La, or Ti.

In one embodiment, M is Ta, the lower dielectric constant is approximately 8, and the higher dielectric constant is approximately 21.

In one embodiment, the graded high-k gate dielectric layer has a thickness approximately in the range of 2-3.5 nanometers.

In one embodiment, the III-V material channel region is composed of InGaAs, the graded high-k gate dielectric layer is composed of TaAlOx, and the gate electrode is a metal gate electrode.

In an embodiment, a semiconductor device includes a hetero-structure disposed above a substrate and having a three-dimensional group III-V material body with a channel region. A source and drain material region is disposed above the three-dimensional group III-V material body. A trench is disposed in the source and drain material region separating a source region from a drain region, and exposing at least a portion of the channel region. A gate stack is disposed in the trench and on the exposed portion of the channel region. The gate stack includes a graded high-k gate dielectric layer conformal with the trench and the channel region, and a gate electrode disposed on the graded high-k gate dielectric layer.

In one embodiment, the graded high-k gate dielectric layer has a lower dielectric constant proximate the channel region and has a higher dielectric constant proximate the gate electrode.

In one embodiment, the graded high-k gate dielectric layer is composed of MAlOx having a greater concentration of aluminum proximate the channel region and a lesser concentration of aluminum proximate the gate electrode. M is a metal such as, but not limited to, Ta, Zr, Hf, Gd, La, or Ti.

In one embodiment, M is Ta, the lower dielectric constant is approximately 8, and the higher dielectric constant is approximately 21.

In one embodiment, the graded high-k gate dielectric layer has a thickness approximately in the range of 2-3.5 nanometers.

In one embodiment, the material channel region is composed of InGaAs, the graded high-k gate dielectric layer is composed of TaAlOx, and the gate electrode is a metal gate electrode.

In one embodiment, the hetero-structure further includes a top barrier layer disposed between the source and drain material region and the three-dimensional group III-V material body. The trench is also disposed in the top barrier layer.

In one embodiment, the hetero-structure further includes a bottom barrier layer disposed between the substrate and the three-dimensional group III-V material body.

In one embodiment, the trench is also partially disposed in the bottom barrier layer, completely exposing the channel region, and the gate stack completely surrounds the channel region.

In an embodiment, a semiconductor device includes a vertical arrangement of a plurality of group III-V material nanowires disposed above a substrate. A gate stack is disposed on and completely surrounds the channel region of each of the group III-V material nanowires. The gate stack includes a graded high-k gate dielectric layer disposed on each of the channel regions. A gate electrode is disposed on the graded high-k gate dielectric layer. Source and drain regions surround portions of each of the group III-V material nanowires, on either side of the gate stack.

In one embodiment, the graded high-k gate dielectric layer has a lower dielectric constant proximate each of the channel regions and has a higher dielectric constant proximate the gate electrode.

In one embodiment, the graded high-k gate dielectric layer is composed of MAlOx having a greater concentration of aluminum proximate the channel regions and a lesser concentration of aluminum proximate the gate electrode. M is a metal such as, but not limited to, Ta, Zr, Hf, Gd, La, or Ti.

In one embodiment, M is Ta, the lower dielectric constant is approximately 8, and the higher dielectric constant is approximately 21.

In one embodiment, the graded high-k gate dielectric layer has a thickness approximately in the range of 2-3.5 nanometers.

In one embodiment, the channel regions are composed of InGaAs, the graded high-k gate dielectric layer is composed of TaAlOx, and the gate electrode is a metal gate electrode.

In one embodiment, the semiconductor structure further includes a top barrier layer disposed between the source and drain regions and each of the group III-V material nanowires.

In one embodiment, the semiconductor structure further includes a bottom barrier layer disposed between the substrate and the bottom-most group III-V material nanowire. A bottom portion of the gate stack is disposed on the bottom barrier layer.

What is claimed is:

1. An integrated circuit structure, comprising:
    a semiconductor nanowire above a substrate, the semiconductor nanowire comprising a group III-V material;
    a gate electrode surrounding at least a portion of a channel region of the semiconductor nanowire, the channel region comprising the group III-V material;
    a gate dielectric between the gate electrode and the channel region of the semiconductor nanowire, the gate dielectric having a lower dielectric constant proximate the channel region graded to a higher dielectric constant proximate the gate electrode, wherein the grading is a continuous dielectric constant grading from the lower dielectric constant to the higher dielectric constant, wherein the graded high-k gate dielectric layer comprises MAlOx having a greater concentration of aluminum proximate the III-V material channel region and a lesser concentration of aluminum proximate the gate electrode, where M is selected from the group consisting of Ta, Zr, Hf, Gd, and Ti;
    a source region in the semiconductor nanowire at a first side of the gate electrode; and
    a drain region in the semiconductor nanowire at a second side of the gate electrode opposite the first side of the gate electrode.

2. The integrated circuit structure of claim 1, wherein the gate electrode completely surrounds the channel region of the semiconductor nanowire.

3. The integrated circuit structure of claim 1, wherein the gate dielectric has a thickness approximately in the range of 2-3.5 nanometers.

4. The integrated circuit structure of claim 1, wherein the group III-V material is InGaAs.

5. The integrated circuit structure of claim 4, wherein the gate dielectric comprises TaAlOx.

6. An integrated circuit structure, comprising:
    a semiconductor nanowire above a substrate, the semiconductor nanowire comprising a group III-V material;
    a gate electrode surrounding at least a portion of a channel region of the semiconductor nanowire, the channel region comprising the group III-V material;
    a gate dielectric between the gate electrode and the channel region of the semiconductor nanowire, the gate dielectric having a lower dielectric constant proximate the channel region graded to a higher dielectric constant proximate the gate electrode, wherein the grading is a continuous dielectric constant grading from the lower dielectric constant to the higher dielectric constant, wherein the graded high-k gate dielectric layer comprises MAlOx having a greater concentration of aluminum proximate the III-V material channel region and a lesser concentration of aluminum proximate the gate electrode, where M is selected from the group consisting of Ta, Zr, Hf, Gd, and Ti;
    an embedded source region adjacent the semiconductor nanowire at a first side of the gate electrode; and
    an embedded drain region adjacent the semiconductor nanowire at a second side of the gate electrode opposite the first side of the gate electrode.

7. The integrated circuit structure of claim 6, wherein the embedded source region and the embedded drain region comprise a semiconductor material different than the semiconductor nanowire.

8. The integrated circuit structure of claim 6, wherein the gate electrode completely surrounds the channel region of the semiconductor nanowire.

9. The integrated circuit structure of claim 6, wherein the gate dielectric has a thickness approximately in the range of 2-3.5 nanometers.

10. The integrated circuit structure of claim 6, wherein the group III-V material is InGaAs.

11. The integrated circuit structure of claim 10, wherein the gate dielectric comprises TaAlOx.

12. An integrated circuit structure, comprising:
    a semiconductor fin above a substrate, the semiconductor fin comprising a group III-V material;
    a gate electrode over a top surface of the semiconductor fin and adjacent sidewalls of the semiconductor fin;
    a gate dielectric between the gate electrode and a channel region of the semiconductor fin, the channel region comprising the group III-V material, and the gate dielectric having a lower dielectric constant proximate the channel region graded to a higher dielectric constant proximate the gate electrode, wherein the grading is a continuous dielectric constant grading from the lower dielectric constant to the higher dielectric constant, wherein the graded high-k gate dielectric layer comprises MAlOx having a greater concentration of aluminum proximate the III-V material channel region and a lesser concentration of aluminum proximate the gate electrode, where M is selected from the group consisting of Ta, Zr, Hf, Gd, and Ti;
    a source region adjacent to the channel region at a first side of the gate electrode; and
    a drain region adjacent to the channel region at a second side of the gate electrode opposite the first side of the gate electrode.

13. The integrated circuit structure of claim 12, wherein M is Ta.

14. The integrated circuit structure of claim 13, wherein the lower dielectric constant is approximately 8 and the higher dielectric constant is approximately 21.

15. The integrated circuit structure of claim 12, wherein the gate dielectric has a thickness approximately in the range of 2-3.5 nanometers.

16. The integrated circuit structure of claim 12, wherein the group III-V material is InGaAs.

17. The integrated circuit structure of claim 16, wherein the gate dielectric comprises TaAlOx.

18. The integrated circuit structure of claim 17, wherein the gate electrode comprises a metal in contact with the gate dielectric.

19. The integrated circuit structure of claim 12, wherein the lower dielectric constant is approximately 8 and the higher dielectric constant is approximately 21.

* * * * *